US012622172B2

(12) United States Patent
Mori et al.

(10) Patent No.: US 12,622,172 B2
(45) Date of Patent: May 5, 2026

(54) THERMOELECTRIC MATERIAL, METHOD FOR PRODUCING SAME, AND THERMOELECTRIC POWER GENERATION ELEMENT

(71) Applicant: National Institute for Materials Science, Tsukuba (JP)

(72) Inventors: Takao Mori, Tsukuba (JP); Zihang Liu, Tsukuba (JP)

(73) Assignee: National Institute for Materials Science, Tsukuba (JP)

( * ) Notice: Subject to any disclaimer, the term of this patent is extended or adjusted under 35 U.S.C. 154(b) by 553 days.

(21) Appl. No.: 18/026,801

(22) PCT Filed: Aug. 25, 2021

(86) PCT No.: PCT/JP2021/031105
§ 371 (c)(1),
(2) Date: Mar. 16, 2023

(87) PCT Pub. No.: WO2022/059443
PCT Pub. Date: Mar. 24, 2022

(65) Prior Publication Data
US 2023/0329115 A1     Oct. 12, 2023

(30) Foreign Application Priority Data

Sep. 16, 2020     (JP) ................................. 2020-155093

(51) Int. Cl.
*H10N 10/853*          (2023.01)
*B22F 3/105*           (2006.01)
(Continued)

(52) U.S. Cl.
CPC ........... *H10N 10/853* (2023.02); *B22F 3/105* (2013.01); *B22F 9/04* (2013.01); *C22C 1/047* (2023.01);
(Continued)

(58) Field of Classification Search
CPC ....................................................... C22C 1/047
See application file for complete search history.

(56) References Cited

U.S. PATENT DOCUMENTS 9,054,274 B2     6/2015  Funahashi et al.
2006/0063291 A1  3/2006  Shin et al.
(Continued)

FOREIGN PATENT DOCUMENTS

JP     A 2004-179643     6/2004
JP     A2006-040963      2/2006
(Continued)

OTHER PUBLICATIONS

Tan Gangjian et al: "Rationally Designing High-Performance Bulk Thermoelectric Materials", Chemical Reviews, vol. 116, No. 19, Oct. 12, 2016 (Oct. 12, 2016), pp. 12123-12149, XP055912156, US ISSN: 0009-2665, 001: 10.1021.
(Continued)

*Primary Examiner* — Peter F Godenschwager
(74) *Attorney, Agent, or Firm* — Trojan Law Offices, P.C.

(57)          ABSTRACT

Provided are a thermoelectric material having excellent thermoelectric characteristics at room temperature; a method for producing same; and a thermoelectric power generation element. In an embodiment of the present invention, the thermoelectric material contains an inorganic compound containing magnesium (Mg), silver (Ag), antimony (Sb) and copper (Cu), and is represented by the formula $Mg_{1-a}Cu_aAg_bSb_c$, and the parameters a, b and c satisfy: $0<a\leq0.1$, $0.95\leq b\leq1.05$ and $0.95\leq c\leq1.05$. The inorganic compound may be an $\alpha$ phase of a half-Heusler structure and have the symmetry of the space group I-4c2.

17 Claims, 7 Drawing Sheets

(51) Int. Cl.

| | |
|---|---|
| *B22F 9/04* | (2006.01) |
| *C22C 1/047* | (2023.01) |
| *C22C 30/02* | (2006.01) |
| *H10N 10/01* | (2023.01) |
| *H10N 10/17* | (2023.01) |

(52) U.S. Cl.

CPC .............. *C22C 30/02* (2013.01); *H10N 10/01* (2023.02); *H10N 10/17* (2023.02); *B22F 2003/1051* (2013.01); *B22F 2009/041* (2013.01); *B22F 2202/13* (2013.01); *B22F 2301/058* (2013.01); *B22F 2301/10* (2013.01); *B22F 2301/255* (2013.01); *B22F 2998/10* (2013.01); *B22F 2999/00* (2013.01)

(56) References Cited

U.S. PATENT DOCUMENTS

| | | |
|---|---|---|
| 2009/0211619 A1 | 8/2009 | Sharp et al. |
| 2016/0326615 A1 | 11/2016 | Ren et al. |

FOREIGN PATENT DOCUMENTS

| | | |
|---|---|---|
| JP | A2011-181725 | 9/2011 |
| JP | A2012-248819 | 12/2012 |
| WO | WO 2004/044996 | 5/2004 |
| WO | WO 2012/011334 | 1/2012 |

OTHER PUBLICATIONS

Oueldna Nouredine et al: "Seebeck coefficient in multiphase thin films", Materials Letters, Elsevier, Amsterdam, NL, vol. 266, Feb. 3, 2020 (Feb. 3, 2020), XP086081145, ISSN: o167-577X, DOI: Text 10.1016/J.MATLET.2020.127460.

Jang Eunhwa et al: "Thennoelectric properties enhancement of p-type composite films using wood-based binder and mechanical pressing", Scientific Reports, vol. 9, No. 1, May 27, 2019 (May 27, 2019), XP0931 13436, US ISSN: 2045-2322, DOI: 10.I038/s41598-019-44225-z.

European Patent Office, Application No. 21869130.1-1103 / 4215633 PCT/JP2021031105, European Search Report.

Sui, Jiehe, et al., "Effect of Cu concentration on thermoelectric properties of nanostructured p-type MgAg0.97-x CuxSb0.99" Acta Materialia, 2015, vol. 87, pp. 266-272.

Hashiba, Miri, et al., "Thermoelectric performance of MgAgSb," Meeting Abstracts of the Physical Society of Japan, 2018, vol. 73, No. 1, p. 22aPS-24.

Zheng, Yanyan, et al., "Cost effective synthesis of p-type Zn-doped MgAgSb by planetary ballmilling with enhanced thermoelectric properties," RSC Advances, 2018, vol. 8, No. 62, pp. 35353-35359.

Tan, Gangjian, et al., "Rationally Designing High-Performance Bulk Thermoelectric Materials," Chemical Reviews, 2016, vol. 116, No. 19. pp. 12123-12149.

THERMOELECTRIC MATERIAL, METHOD FOR PRODUCING SAME, AND THERMOELECTRIC POWER GENERATION ELEMENT

TECHNICAL FIELD

This invention relates to a thermoelectric material, a method for producing the same, and a thermoelectric power generation element and specifically relates to a thermoelectric material containing a MgAgSb-based thermoelectric material, a method for producing the same, and a thermoelectric power generation element thereof.

BACKGROUND ART

It is a current situation that about three-fourths of the primary supply energy are disposed of as thermal energy in the waste heat recovery in our country where energy conservation is particularly advanced in the world. Under such a circumstance, a thermoelectric power generation element is attracting attention as a solid-state element that can recover the thermal energy and directly convert the thermal energy into the electric energy.

Since the thermoelectric power generation element is a direct conversion element into the electrical energy, it has an advantage in the easy maintenance such as ease of maintenance and scalability due to the absence of movable parts. Therefore, an active material research has been conducted with respect to thermoelectric semiconductors as an IoT operating power supply.

For IoT operation power supply applications, a thermoelectric material is expected to be used practically near room temperature and the thermoelectric material with the highest performance near room temperature is typically a $Bi_2Te_3$-based material, which has a disadvantage in a wide range of practical application due to the scarcity of Te. While only few materials having relatively high performance at room temperature other than the Te compounds were recognized, a MgAgSb-based material, however, has been proposed as a candidate (for example, Patent References 1 and 2).

According to Patent Reference 1, the formula $A_{x-w}B_{y+w}C_{z-w}D_w$ (A is one or more elements selected from the group consisting of Mg, Ca, Sr, Ba, Eu, Yb, Ti, Mn, Fe, Ni, Cu, Zn, Cd, Hg and a combination thereof; B is one or more elements selected from the group consisting of Na, K, Rb, Cs, Cu, Ag, Au and a combination thereof; C is one or more elements selected from the group consisting of As, Sb, Bi and a combination thereof; and D is one or more elements selected from the group consisting of Se, Te and a combination thereof; and w is from about 0 to about 1; x is from about 0.9 to about 1.1; y is from about 0.9 to about 1.1; and z is from about 0.9 to about 1.1) material is disclosed.

According to Patent Reference 2, the $X_{1-n}A_nY_{1-m}B_mZ_{1-q}C_q$ (X, Y and Z are Mg, Ag and Sb, respectively; and n, m and q are from about 0.0001 to about 0.5000, respectively) material is disclosed.

As an important characteristic factor of the thermoelectric material, there is the dimensionless thermoelectric figure of merit ZT, which is represented by the following equation.

$$ZT=S^2T/(\rho \cdot k)$$

Here, S is a Seebeck coefficient, $\rho$ is an electric resistivity, T is an absolute temperature, and k is a thermal conductivity. Furthermore, $S^2/\rho$ is a power factor (also called electrical output factor), which corresponds to the power generated per unit temperature. That is, in order to improve ZT, it is effective to improve the power factor and reduce the thermal conductivity k. The thermal conductivity k can be selectively reduced by controlling the morphology of the material, but it is necessary to modify the material in order to improve the power factor.

Even in the above mentioned Patent References 1 and 2, the power factor is not sufficient at room temperature. To considering IoT power generation applications, it is expected that a thermoelectric material having a high power factor exceeding 25 $\mu Wcm^{-1} K^{-2}$ at room temperature will be developed.

PRIOR ART REFERENCE

Patent Reference

[Patent Reference 1] US Patent Application Publication No. 2009/0211619, specification.
[Patent Reference 2] US Patent Application Publication No. 2016/0326615, specification.

SUMMARY OF THE INVENTION

Problem to be Solved by the Invention

From the above, in an embodiment of the present invention, it is an issue to provide a thermoelectric material with excellent thermoelectric properties at room temperature, a manufacturing method thereof, and a thermoelectric power generation element thereof.

Means to Solve the Problem

In an embodiment of the present invention, the thermoelectric material includes an inorganic compound containing magnesium (Mg), silver (Ag), antimony (Sb), and copper (Cu), and the inorganic compound is represented by $Mg_{1-a}Cu_aAg_bSb_c$, where the parameters a, b and c satisfy:

$$0<a\leq0.1,$$

$$0.95\leq b\leq1.05, \text{ and}$$

$$0.95\leq c\leq1.05.$$

The above-mentioned issue is solved.
The parameter a may satisfy:

$$0.005\leq a\leq0.05.$$

The parameter a may satisfy:

$$0.005\leq a\leq0.02.$$

The inorganic compound may be an alpha ($\alpha$) phase of a half-Heusler structure and have the symmetry of the space group I-4c2.
The thermoelectric material may be p-type.
The thermoelectric material may be in a form selected from the group consisting of a powder, a sintered body and a thin film.
The thermoelectric material may be in the form of a thin film and may further contain an organic material.
In an embodiment of the present invention, the method of manufacturing the above thermoelectric material may include blending (mixing) a raw material containing magnesium (Mg), a raw material containing silver (Ag), a raw material containing antimony (Sb), and a raw material containing copper (Cu) so as to prepare a mixture thereof, and sintering the mixture. The above-mentioned issue is solved.

The preparation of the above-mentioned mixture may further include mechanical alloying the raw material containing magnesium (Mg), the raw material containing silver (Ag), and the raw material containing copper (Cu); and mechanical alloying the raw material containing Sb and the Mg—Ag—Cu alloy obtained by the above-mentioned mechanical alloying.

The above-mentioned sintering may be conducted by spark plasma sintering.

The spark plasma sintering may be performed in the temperature range of at least 473 K and not exceeding 773 K, under a pressure of at least 50 MPa and not exceeding 100 MPa, for a duration of at least 1 minute and not exceeding 10 minutes.

It may further include pulverizing the sintered body obtained by the above-mentioned sintering.

It may further include mixing the powder obtained by the above-mentioned pulverizing with an organic material.

It may further include performing a physical vapor deposition method using, as a target, the sintered body having been obtained by the above-mentioned sintering.

In an embodiment of the present invention, the thermoelectric power generation element may have p-type and n-type thermoelectric materials connected in series alternately, and the p-type thermoelectric material may be the above-mentioned thermoelectric material. The above-mentioned issue is solved.

Effect of the Invention

In an embodiment of the present invention, the thermoelectric material includes an inorganic compound containing magnesium (Mg), silver (Ag), antimony (Sb), and copper (Cu). The inorganic compound is represented by $Mg_{1-a}Cu_aAg_bSb_c$ and the parameters satisfy: $0 a \leq 0.1$, $0.95 \leq b \leq 1.05$, and $0.95 \leq c \leq 1.05$. Thus, a thermoelectric material having an improved power factor and improved electric conductivity at room temperature by replacing partially Mg with Cu in the inorganic compound of the parent phase comprising: Mg, Ag, and Sb can be provided. Such a thermoelectric material is advantageous for a thermoelectric power generation element.

In an embodiment of the present invention, the method of manufacturing the thermoelectric material comprises: mixing a raw material including magnesium (Mg), a raw material including silver (Ag), a raw material including antimony (Sb), and a raw material including copper (Cu), and preparing the mixture; and sintering the mixture such that the above-mentioned thermoelectric material can be obtained such that the method is excellent in general versatility.

EMBODIMENT FOR CARRYING OUT THE INVENTION

Figure 1A:
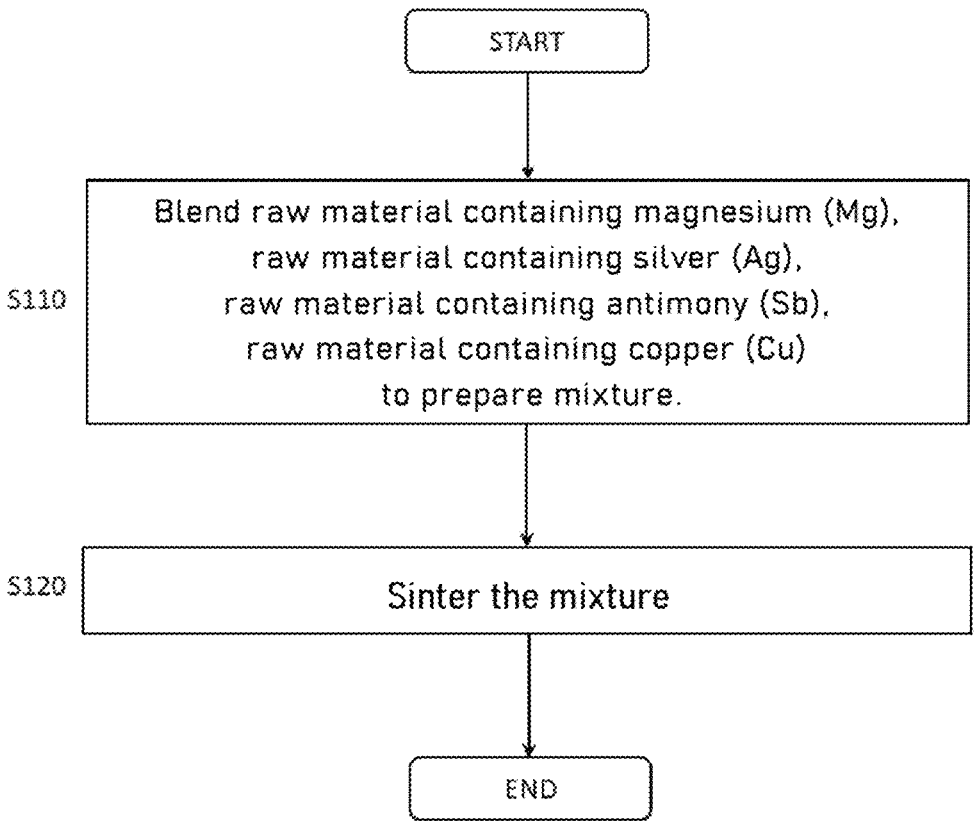
FIG. 1A shows a flowchart illustrating processes of manufacturing a thermoelectric material in an embodiment of the present invention.

In the following, an embodiment for carrying out the present invention will be explained with reference to the drawings. It should be noted that like numerals refer to like elements and explanations thereof will be omitted.

In an embodiment of the present invention, a thermoelectric material includes an inorganic compound including magnesium (Mg), silver (Ag), antimony (Sb), and copper (Cu). The inorganic compound is represented by $Mg_{1-a}Cu_aAg_bSb_c$, and the parameters a to c satisfy:

$$0 < a \leq 0.1,$$

$$0.95 \leq b \leq 1.05, \text{ and}$$

$$0.95 \leq c \leq 1.05, \text{ respectively.}$$

In the composition as described above, the composition may comprise the inorganic compound as a parent phase including Mg, Ag, and Sb in which Mg is partially replaced with Cu. The thermoelectric material having improved electric conductivity especially at room temperature (in the temperature range of at least 273 K and not exceeding 320 K) and the improved power factor can be provided. In an embodiment of the present invention, the thermoelectric material can serve as an p-type thermoelectric material having holes as carriers by satisfying the above-described composition.

It is considered that the parent phase of the inorganic compound preferably includes $Mg_{1-a}Ag_bSb_c$ and its Mg sites are partially replaced with Cu. Here, the parent phase comprises preferably a MgAgSb-based crystal and an α-phase of the half-Heusler structure, and belongs to the I-4c2 space group (120th of the International Tables for Crystallography). Here, in the specification of the present application, it should be noted that "−4" represents 4 over bar (the letter 4 with an overbar).

The MgAgSb-based crystal may comprise the above-mentioned elements (for example, Mg, Ag, and Sb) and may have the above-mentioned crystal structure (for example, half-Heusler structure) and space groups (for example, I-4c2 space group) at room temperature. There are no other restrictions than the above-mentioned, and by way of example, $Mg_1Ag_1Sb_1$, $Mg_{0.98}Ag_{1.02}Sb_1$, $Mg_1Ag_{1.01}Sb_{1.02}$, and so on may be cited.

Figure 1B:
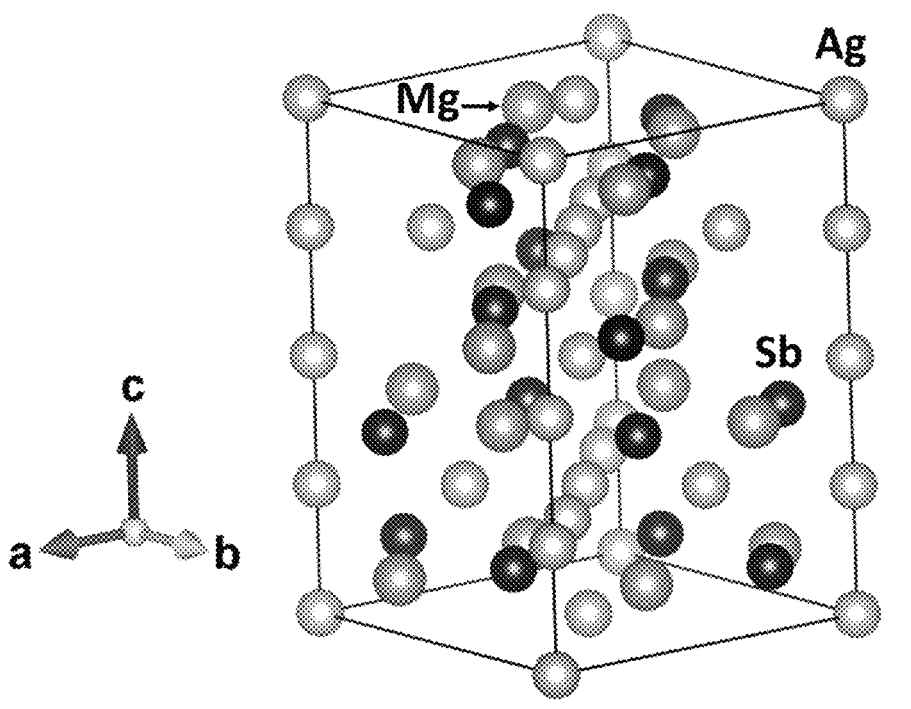
FIG. 1B shows a schematic diagram illustrating a MgAgSb-based crystal having a characteristic structure of half-Heusler compound.

FIG. 1B shows a schematic diagram illustrating the crystal structure of MgAgSb-based crystal. In the MgAgSb-based crystal, the lattice constants may change due to substitutional solid solution by replacing partially Mg with Cu, but it is considered that the atomic positions given by the crystal structure and the sites occupied by the atoms with their coordinates would not change significantly enough to break the chemical bonds between the skeleton atoms. In an embodiment of the present invention, if the lattice constants obtained by the Rietveld analysis of X-ray or neutron diffraction results in the I-4c2 space group match the theoretical values (a=9.1761 Å, b=9.1761 Å, c=12.696 Å) within ±5%, it can be determined that the crystal is the MgAgSb-based crystal.

The parameter a, which represents the amount of Cu component, is greater than 0. It is more preferable that the parameter a may be at least the above-mentioned value or at least 0.005. The parameter a may be not exceeding 0.1, and preferably not exceeding 0.05 or more preferably not exceeding 0.02. It may also satisfy the range of $0 < a \leq 0.1$ or preferably satisfy the range of $0.005 \leq a \leq 0.05$. In such a range, the effect of the Cu addition can further increase the electric conductivity at room temperature and improve the power factor. The parameter a may more preferably satisfy the range $0.005 \leq a \leq 0.02$. In this range, the power factor at room temperature can be improved.

Here, the substitutional solid solution of Cu atoms can be observed by the transmission electron microscopy (TEM) and by the electron energy loss spectroscopy (EELS). Simplistically, this can be judged by the composition and the powder X-ray diffraction analysis. For example, if the composition of the material of interest satisfies the above-mentioned composition formula and the lattice constants of the a-axis and c-axis are substantially unchanged compared to those of the material without any added Cu, it may be judged that Cu is solid-solved therein as substitutional solid solution. Here, it may be judged that the lattice constants are not substantially changed, for example, if relative errors of respective lattice constants are within ±5% against the theoretical ones.

In an embodiment of the present invention, the thermoelectric material may be in a form selected from the group consisting of a powder, a sintered body, and a thin film. In this way, the material can be applied to various kinds of thermoelectric power generation elements that exhibit high thermoelectric performance at room temperature.

In an embodiment of the present invention, the thermoelectric material is sintered by the method as described later to produce the sintered body, and the powder is obtained by pulverizing the sintered body. In an embodiment of the present invention, if the thermoelectric material is a thin film, it may be a crystalline thin film made by a physical vapor deposition method or the like using a sintered material as a target, or it may be a thin film containing the powder as described above. Here, in general, the powder may include what is crushed to become fine and a powder. The powder can be pressed by a press such as a powder compactor such that a compact may be formed. In general, the compact is what is formed into a predetermined shape by compressing the powder. When the compact is heated at a temperature below the melting point of the powder components, the mutual contact surfaces of the powder particles adhere to each other such that the compact shrinks and is densified with an increase of the heating time, the phenomenon of which may be called sintering, and the product obtained by the sintering may be called a sintered body. The thin film is referred to a film that is thin and may include a layer formed by condensation of a vapor phase on a solid surface.

In an embodiment of the present invention, when the thermoelectric material is a film containing powder of an inorganic compound, the powder is mixed with an organic material and processed and formed in a film. In this case, the organic material may comprise at least one kind selected from the group consisting of poly(3,4-ethylenedioxythiophene) polystyrene sulfonate (PEDOT:PSS), poly[2,5-bis(3-tetradecylthiophen-2-yl)thieno[3,2-b]thiophene] (PBTT), polyaniline (PANI), tetrathiafulvalene (TTF), and benzodifurandione paraphenylenevinylidene (BDPPV) and the organic material may be used. A flexible film thermoelectric material may be provided by using these organic materials.

In this case, as long as the film can be formed, there is no restriction about the amount of contained powder, but preferably the powder may be contained in the range of at least 4 mass % and not exceeding 80 mass %, preferably in the range of at least 4 mass % and not exceeding 50 mass %, further preferably in the range of at least 4 mass % and not exceeding 10 mass %, yet more preferably in the range of at least 4 mass % and not exceeding 7 mass %, with respect to the organic material. This can result in a membrane with flexibility and thermoelectric performance.

In an embodiment of the present invention, the thermoelectric material may have improved electrical conductivity especially at room temperature and power factor may be improved. In the thermoelectric material with added Cu, the power factor not only at room temperature but also at higher temperatures (for example, 400 K to 600 K).

Next, in such an embodiment of the present invention, an exemplary manufacturing method of the thermoelectric material is described.

FIG. 1A shows a flowchart illustrating processes of manufacturing the thermoelectric material in an embodiment of the present invention.

Step S110: Blending a raw material including magnesium (Mg), a raw material including silver (Ag), a raw material including antimony (Sb) and a raw material including copper (Cu), and preparing a mixture thereof.

Step S120: Firing the mixture obtained in step S110.

In an embodiment of the present invention, the thermoelectric material is obtained by the above-mentioned steps S110 and S120. Each step is described in detail.

In step S110, the raw material including Mg may be Mg single metal or Mg silicide, oxide, carbonate, nitride, oxynitride, chloride, fluoride, or acid fluoride. The raw material including Ag may be Ag single metal or Ag silicide, oxide, carbonate, nitride, oxynitride, chloride, fluoride, or acid fluoride. The raw material including Sb may be Sb single metal or Sb silicide, oxide, carbonate, nitride, oxynitride, chloride, fluoride, or acid fluoride. The raw material including Cu may be Cu single metal or Cu silicide, oxide, carbonate, nitride, oxynitride, chloride, fluoride, or acid fluoride. It is preferable that the raw materials are in the form of powder, grain, or small lump in view of mixability and easy handling.

In step S110, the metal elements in the raw materials are mixed such that the following composition formula $Mg_{1-a}Cu_aAg_bSb_c$ may be satisfied. Here, the parameters a, b and c satisfy:

$$0 < a \leq 0.1,$$

$$0.95 \leq b \leq 1.05, \text{ and}$$

$$0.95 \leq c \leq 1.05.$$

Here, the preferred parameters are as described above and the explanation thereof is omitted.

It is preferable to use mechanical alloying in step S110. In detail, it may be OK to conduct mechanical alloying of Mg metal as the raw material including Mg, Ag metal as the raw material including Ag, and Cu metal as the raw material including Cu, and then to conduct mechanical alloying of the thus-obtained Mg—Ag—Cu alloy and Sb metal as the raw material including Sb. In this way, the Mg—Ag—Cu—Sb alloy may be obtained. By using such alloys, the amounts of impurity phases are reduced and the highly pure thermoelectric material can be obtained.

In step S120, the sintering may be performed by any method such as spark plasma sintering (SPS), hot press sintering (HP), hot isostatic pressure sintering (HIP), cold isostatic pressure sintering (CIP), pulse electric current sintering, and it is preferably performed by the spark plasma sintering (SPS). In this way, a sintered body with suppressed grain growth for a short time may be obtained without using any sintering aids.

The SPS may preferably be performed in the temperature range of at least 473 K and not exceeding 773 K, under a pressure of at least 50 MPa and not exceeding 100 MPa, for a period of time of at least 1 minute and not exceeding 10 minutes. Under this condition, the thermoelectric material can be obtained with a good yield ratio in an embodiment of the present invention of the above-mentioned sintered body.

Furthermore, the thus-obtained sintered body may be milled by the mechanical milling such as a ball mill. In an embodiment of the present invention, in this way, a thermoelectric material in the form of powder is obtained.

In an embodiment of the present invention, the thus-obtained thermoelectric material in the form of powder may be mixed with an organic material such that a flexible thermoelectric material may be provided. In this case, the organic material and mixing ratio as described above can be employed.

Alternatively, the thus-obtained sintered material may be used as a target such that a physical vapor deposition method may also be performed. In an embodiment of the present invention, this can provide a thin film comprising a thermoelectric material.

Embodiment 2

In Embodiment 2, the thermoelectric power generation element using the thermoelectric material as described in Embodiment 1 is explained in an embodiment of the present invention.

Figure 2A:
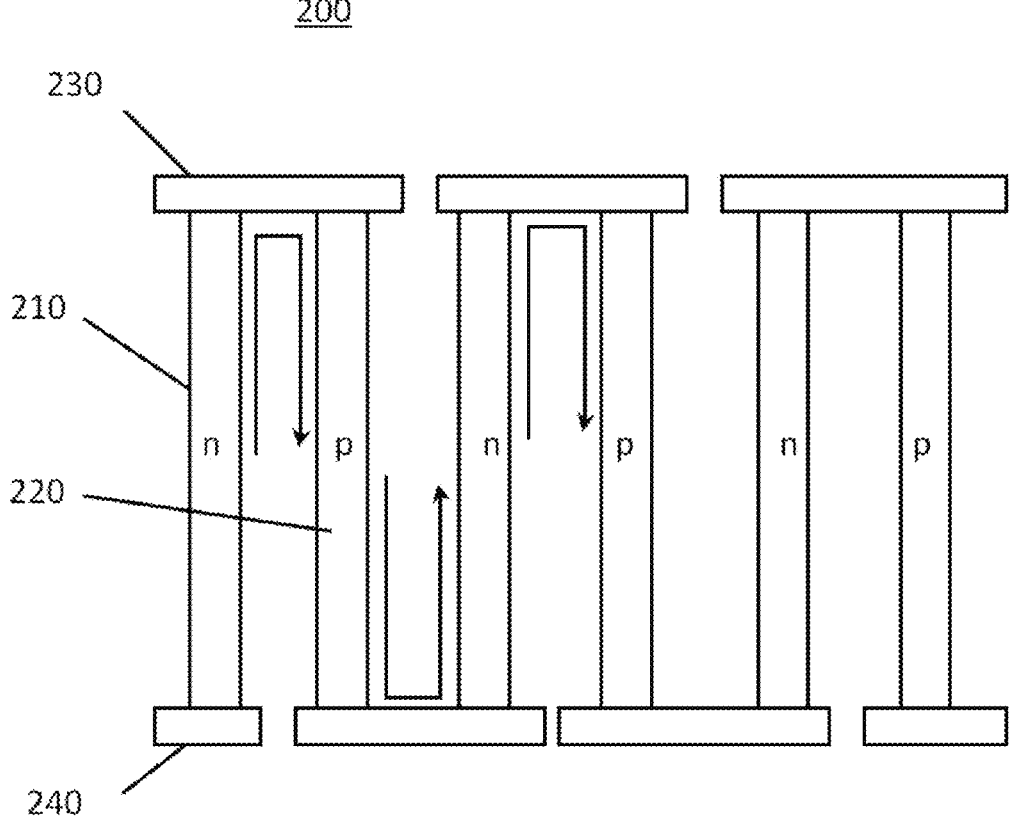
FIG. 2A shows a schematic diagram illustrating a thermoelectric power generation element (n-shaped (pai-shaped)) using a thermoelectric material in an embodiment of the present invention.

FIG. 2A shows a schematic diagram illustrating a thermoelectric power generating element (n-shaped (pai-shaped)) using a thermoelectric material in an embodiment of the present invention.

In an embodiment of the present invention, the thermoelectric power generation element 200 includes a pair of n-type thermoelectric materials 210 and p-type thermoelectric materials 220, and electrodes 230 and 240 at their respective end parts. The electrodes 230 and 240 electrically connect the n-type thermoelectric materials 210 and p-type thermoelectric materials 220 in series.

Here, in an embodiment of the present invention, the p-type thermoelectric materials 220 are the thermoelectric materials as described in Embodiment 1. In an embodiment of the present invention, the thermoelectric material exhibits excellent thermoelectric characteristics, especially at room temperature, which is advantageous for waste heat recovery.

On the other hand, the n-type thermoelectric material 210 is not restricted, but should have a high thermoelectric performance (e.g., ZT of 0.4 to 1.6) at a temperature not exceeding 500 K, especially at room temperature. By way of example, the n-type thermoelectric material 210 may be a $Mg_2Sb_3$-based material, BiTeSe-based material, $CoSb_3$-based material, etc. As an exemplary composition of the $Mg_2Sb_3$-based material, for example, $Mg_{3.2}Sb_{1.5}Bi_{0.5}Te_{0.01}$ is cited. As an exemplary composition of the BiTeS-based material, for example, $Bi_2Te_{2.7}Se_{0.3}$ is cited. As an exemplary composition of the $CoSb_3$-based material, for example, $CoSb_3Si_{0.075}Te_{0.175}$ is cited. It should be noted that these are just examples, but not limiting.

The electrodes 230 and 240 can comprise an ordinary electrode material and, by way of example, Fe, Ag, Al, Ni, Cu, and so on can be cited.

FIG. 2A shows a state that a chip made of the n-type thermoelectric material 210 is joined to the electrode 240 on the side of the lower temperature with solder or the like, and the opposite end part of the chip of the n-type thermoelectric material 210 and the electrode 230 on the side of the higher temperature are joined with solder or the like. Similarly, it shows a state that a chip made of the p-type thermoelectric material 220 is joined to the electrode 230 on the side of the higher temperature with solder or the like, and the opposite end part of the chip of the p-type thermoelectric material 220 and the electrode 240 on the side of the lower temperature are joined with solder or the like.

In an embodiment of the present invention, when the thermoelectric power generation element 200 is installed in an environment where the electrode 230 is on the hotter side and the electrode 240 is on the colder side if compared to the electrode 230, and the electrodes on the end parts are connected to an electric circuit or the like, an electric voltage is generated by the Seebeck effect and an electric current flows in the order of the electrode 240, the n-type thermoelectric material 210, the electrode 230 and the p-type thermoelectric material 220, as shown by the arrow in FIG. 2A. In detail, the current flows according to the principle that the electrons in the n-type thermoelectric material 210 obtain thermal energy from the hot-side electrode 230 and move to the cold-side electrode 240, where they release thermal energy, while the holes in the p-type thermoelectric material 220 obtain thermal energy from the hot-side electrode 230 and move to the cold-side electrode 240, where the current flows according to the principle of releasing thermal energy.

Since the thermoelectric materials as described in Embodiment 1 are used as the p-type thermoelectric materials 220 in an embodiment of the present invention, a thermoelectric power generation element 200 with a large amount of power generation can be realized especially at room temperature (at least 275 K and not exceeding 320 K). In addition, if the thermoelectric material in an embodiment of the present invention is a powder comprising an inorganic compound having the MgAgSb-based material as the parent phase, in which Cu atoms are substitutionally solid-solved by replacing partially Mg sites, a film including the powder, or if the thermoelectric material in an embodiment of the present invention uses a thin film obtained by making a sintered body comprising the above-mentioned inorganic compound as a target, a flexible thermoelectric module as an IoT power source can be provided. For example, FIG. 2C illustrates how particles 330 made of a sputtered inorganic compound are deposited on a substrate 310 and a thin film 340 is formed thereon by sputtering the sintered body as the target 300 made of the inorganic compound with argon 320. It goes without saying that the thin film 340 can be peeled off from the substrate 310 using existing technologies and formed into a film without the substrate. For example, FIG. 2D illustrates a powder 350 made of this inorganic compound. If the powder 350 is compacted by the powder compactor 370, a compacted body 360 is obtained, and if the compacted body 380 is placed in the sintering furnace 390 and sintered, a sintered body 400 is obtained.

In an embodiment of the present invention, if the thermoelectric material is used, a thermoelectric power generation element 200 with a large amount of power generation at room temperature can be provided, but, in an embodiment of the present invention, the use of the thermoelectric power generation element 200 is not limited in the temperature range higher than the room temperature (for example, 573 K and so on). It goes without saying that the thermoelectric power generation element with large power generation amount can be provided since a high power factor is exhibited even in a high temperature range.

Figure 2B:
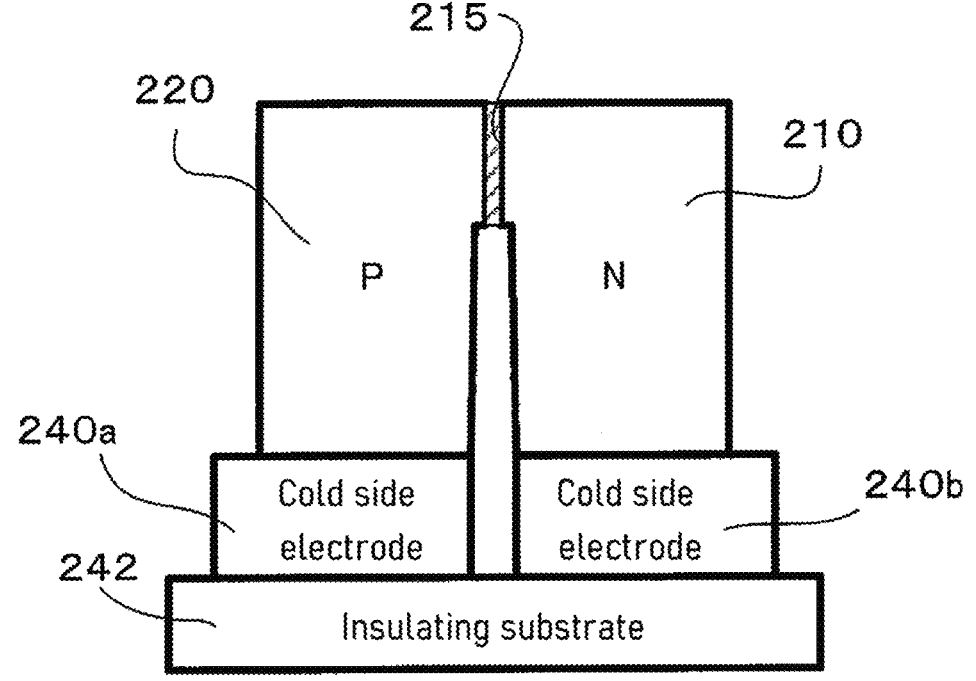
FIG. 2B shows a schematic diagram illustrating a thermoelectric power generation element (U-shaped) using a thermoelectric material in an embodiment of the present invention.
Figure 2C:
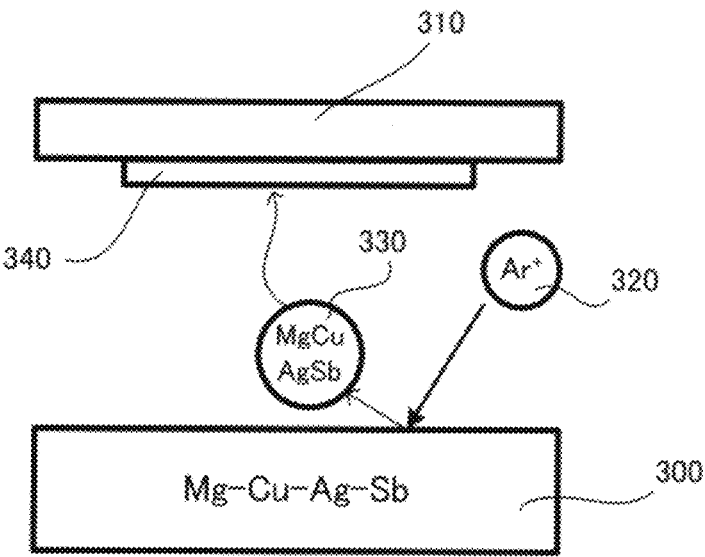
FIG. 2C shows a schematic diagram illustrating thin film production using a thermoelectric material in an embodiment of the present invention.
Figure 2D:
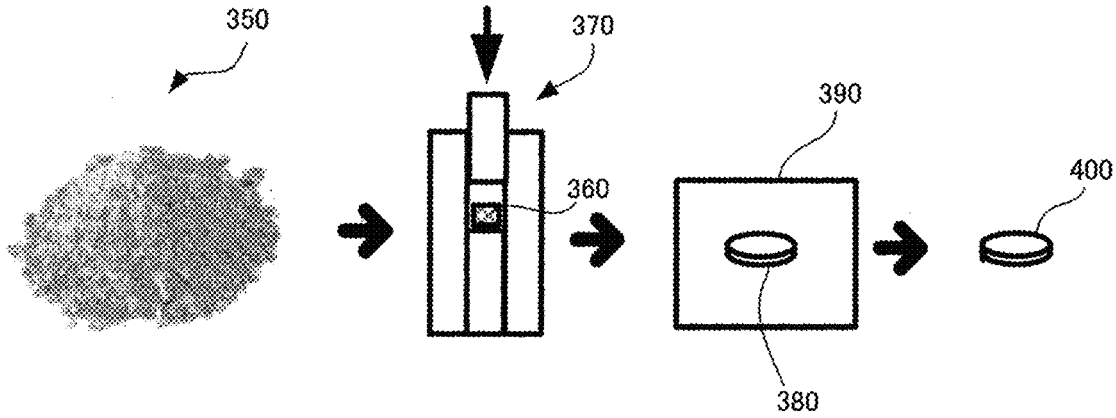
FIG. 2D shows a schematic diagram illustrating a powder, a powder compactor, a sintering furnace, and a sintered body using a thermoelectric material in an embodiment of the present invention.

In FIG. 2A, the explanation is made utilizing the n-shaped thermoelectric generation element, but in an embodiment of the present invention, the thermoelectric material may be used in a U-shaped thermoelectric generation element (FIG. 2B). Similarly with this case, it may be configured by connecting p-type and n-type thermoelectric materials made of the thermoelectric material in series alternately in an embodiment of the present invention.

In the following, details about the present invention are explained using concrete embodiments and it should be understood that the present invention is not limited to these embodiments. The electric conductivity was measured by the DC four-terminal method.

EMBODIMENTS

Raw Materials

In the following examples, Mg (powder, 99.99% purity, Sigma-Aldrich Japan G.K.), Ag (grains, 99.99% purity, Sigma-Aldrich Japan G.K.), Sb (lumps, 99.99% purity, Sigma-Aldrich Japan G.K.), and, if necessary, Cu (powder, 99.99% purity, Sigma-Aldrich Japan G.K.) were used.

Example 1

In Example 1, the thermoelectric material was manufactured by blending the raw materials so as to satisfy the general formula: $Mg_{1-a}Cu_aAg_bSb_c$ (a=0.01, b=0.97, c=0.99).

Each raw material powder was weighed to meet the compositions in Table 1. First, Mg powder, Ag grains and Cu powder were filled into a stainless steel ball mill container in a glove box and subjected to mechanical alloying for 10 hours using a mixer mill (8000M Mixer/Mill, SPEX SamplePrep). In this way, the Mg—Ag—Cu alloy powder was thus obtained.

Next, the Mg—Ag—Cu alloy powder and Sb lumps were then filled into a stainless steel ball mill container in a glove box and subjected to mechanical alloying for 10 hours using the mixer mill. In this way, the Mg—Ag—Cu—Sb alloy powder was obtained.

Then, the Mg—Ag—Cu—Sb alloy powder was sintered at 573 K for 5 minutes with the spark plasma sintering apparatus (SPS, SPS Syntex, Inc., SPS-1080 system). In detail, a graphite sintering die (die) (inner diameter 10 mm, height 30 mm) was filled with the mixture (here, Mg—Ag—Cu—Sb alloy powder), and the mixture was held under uniaxial stress of 80 MPa, at the sintering temperature 573 K with the temperature increase rate: 100 K/min, for 5 min. The sintered body of Example 1 was thus obtained.

Figure 3:
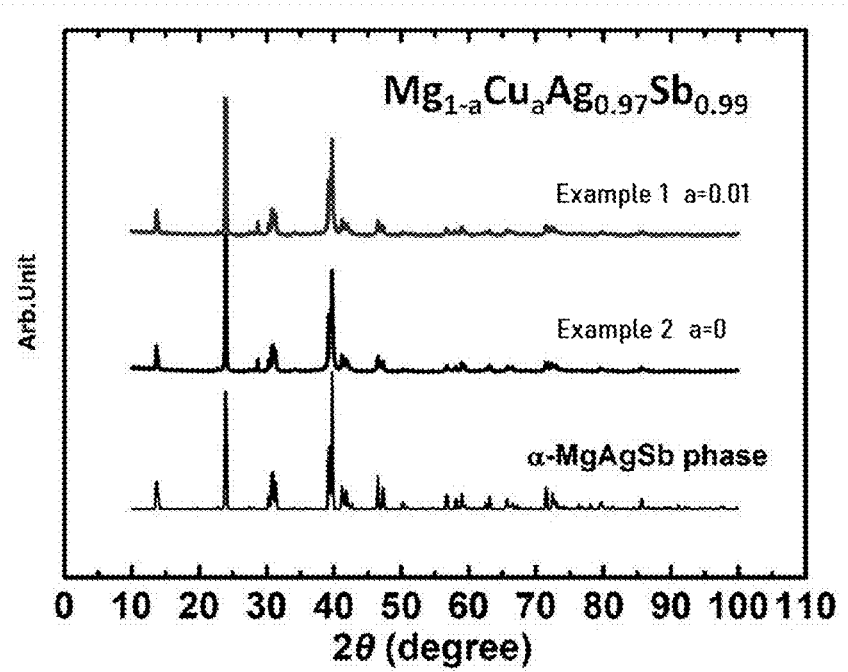
FIG. 3 shows a diagram illustrating XRD patterns of the samples of Examples 1 to 2.

The thus-obtained sintered body was wet milled with ethanol in an agate mortar. After milling, the particles of the fired body were sieved through a mesh (45 μm in aperture), and only particles with a diameter of 45 μm or less that passed through the mesh were taken out. The particles were identified by the powder X-ray diffraction (Rigaku Corporation, SmartLab 3) and analyzed for composition by X-ray fluorescence analysis (HORIBA, Ltd., EMAX Evolution EX). The results of the X-ray diffraction are shown in FIG. 3.

The sintered body was machined into the 1.5 mm×1.5 mm×9 mm rectangular parallelepiped by a high-speed cutter, and electric conductivity and thermoelectric properties were measured. Electrical conductivity was measured by the DC four-terminal method. The Seebeck coefficient and thermal conductivity were measured as thermoelectric properties by the steady-state temperature difference method using the thermoelectric property measurement and evaluation device (ADVANCE RIKO, Inc., ZEM-3) and thermal conductivity evaluation device (Netzsch, HyperflashXXX), respectively. Both measurements were performed under a helium gas atmosphere and in a temperature range from room temperature to 600 K. The electrical output factor (power factor) was calculated from the thermoelectromotive force obtained from the electric conductivity or electric resistivity and the Seebeck coefficient, and the dimensionless thermoelectric figure of merit ZT was calculated from the Seebeck coefficient, the electric conductivity and the thermal conductivity. These results are shown in FIGS. 4 to 9 and Table 2 and discussed later.

Example 2

In Example 2, the raw materials were mixed to satisfy the general formula $Mg_{1-a}Cu_aAg_bSb_c$ (a=0, b=0.97, and c=0.99) and the thermoelectric material was manufactured. Example 2 was prepared in a similar way as Example 1 except that Cu powder was not used such that the explanation thereof is omitted. As in Example 1, the sample of Example 2 was also measured by conducting the X-ray diffraction and the electrical and thermoelectric properties were measured. The results are shown in FIGS. 3 to 9 and Table 2 and discussed later.

For simplicity, Table 1 summarizes the manufacturing condition for the samples of Examples 1 and 2 and the above results are explained.

TABLE 1

| | Lists of design compositions (parameters) and sintering conditions of samples of Examples 1-2 | | | | | | |
| --- | --- | --- | --- | --- | --- | --- | --- |
| | | | | | Sintering conditions | | |
| Example | Mg 1-a | Cu a | Ag b | Sb c | Stress (Mpa) | Temperature (K) | Time (minutes) |
| 1 | 0.99 | 0.01 | 0.97 | 0.99 | 80 | 573 | 5 |
| 3 | 1 | 0 | 0.97 | 0.99 | 80 | 573 | 5 |

FIG. 3 shows a diagram showing the XRD patterns of the samples of Examples 1 to 2.

FIG. 3 also shows the XRD pattern of α-phase MgAgSb for reference. The XRD pattern is based on FIG. 2 in Melanie J. Kirkham et al, PHYSICAL REVIEW B 85, 144120, 2012.

According to FIG. 3, it was found that the diffraction peaks of the XRD patterns of the samples of Examples 1 and 2 all match those of α-phase MgAgSb, indicating that the samples of Examples 1 and 2 were the inorganic compound with the α-phase in the half-Heusler structure and having the symmetry in the I-4c2 space group. According to the compositional analysis, it was confirmed that the compositions of all samples were consistent with the design compositions. And, the a-axis length and the c-axis length of the samples of Examples 1 and 2 were calculated from the XRD patterns in FIG. 3, and they were substantially the same. Form this, it was indicated that Cu was substitutionally solid-solved in Mg sites of the α-phase MgAgSb.

Thus, it was shown that the sample in Example 1 included an inorganic compound in which Cu was solid-solved substitutionally in part of Mg sites of α-phase MgAgSb as the parent phase including Mg, Ag, and Sb.

Figure 4:
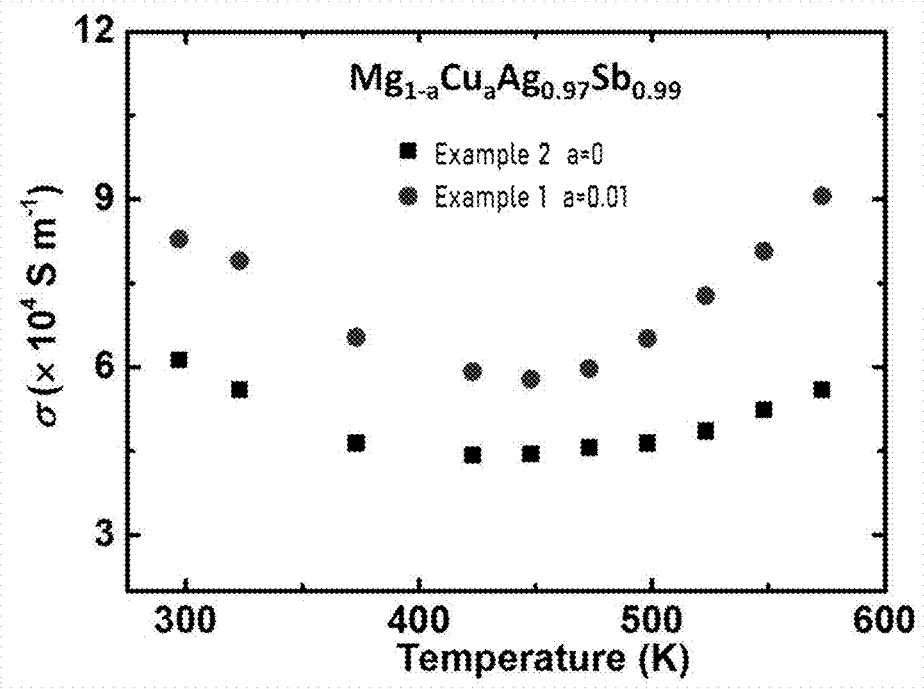
FIG. 4 shows a diagram showing a temperature dependence of electric conductivity of samples of Examples 1 to 2.

FIG. 4 shows the temperature dependence of the electric conductivity of the samples of Examples 1 to 2.

According to FIG. 4, it was found that the electric conductivity of the sample of Example 1 with added was higher than that of the sample of Example 2 without any added Cu in the entire measured temperature range, especially, the electric conductivity of Example 1 significantly increased near room temperature. The sample of Example 1 had the electric conductivity (electric resistivity) that could be used as a thermoelectric material and showed the temperature dependence. In addition, focusing on the electric conductivity at room temperature, the electric conductivity could be increased to about $8 \times 10^4$ $(\Omega m)^{-1}$ at room temperature by controlling the amount of added Cu.

Figure 5:
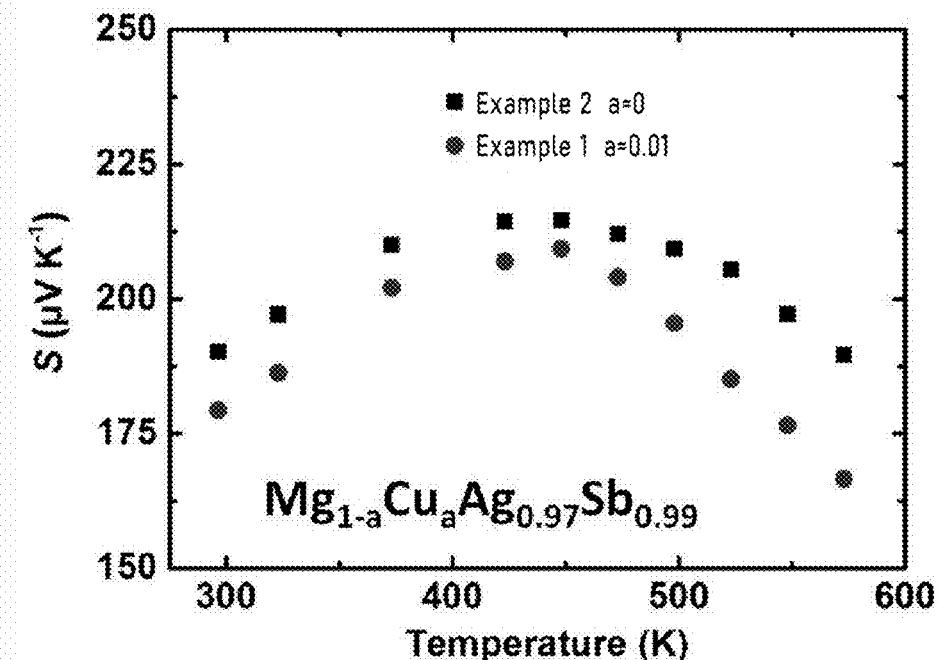
FIG. 5 shows a diagram showing a temperature dependence of Seebeck coefficient of the samples of Examples 1 to 2.

FIG. 5 shows a diagram showing the temperature dependence of the Seebeck coefficient of the samples of Examples 1 to 2.

According to FIG. 5, it was confirmed that both samples were of p-type conduction with large absolute Seebeck coefficients a least 170 μV/K. Surprisingly, the decrease in the magnitude of the Seebeck coefficient was minimized although the electric conductivity was increased by the addition of Cu.

Figure 6:
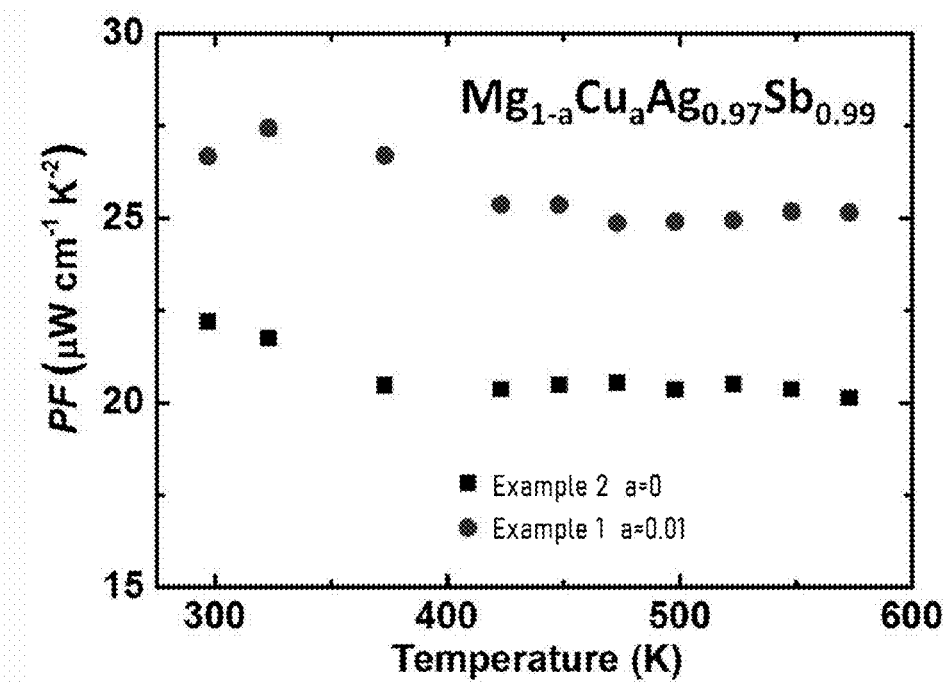
FIG. 6 shows a diagram showing a temperature dependence of electrical output factor of the samples of Examples 1 to 2.

FIG. 6 shows a diagram showing the temperature dependence of the electrical output factor of the samples of Examples 1 to 2.

According to FIG. 6, it was found that the electrical output factor (power factor) of the sample of Example 1 with added Cu was higher than that of the sample of Example 2 without any added Cu in the entire measured temperature range and the electrical output factor of Example 1 increased dramatically especially in the low temperature range from 300 K to 400 K and exceeded even 25 μWcm$^{-1}$ K$^{-2}$. From the above, the thermoelectric power generation element for consumer use may be provided since it is said to be suitable for various kinds of thermoelectric cooling applications and for recovering poor heat as a power source for IoT operation.

In FIG. 19C of the Patent Reference 2, the power factor is shown as the thermoelectric performance of MgAg$_{0.97-x}$Cu$_x$Sb$_{0.99}$ (x=0.003, 0.007, 0.01) with Ag sites replaced by Cu and the power factor shows the maximum value of 22 μWcm$^{-1}$ K$^{-2}$ from room temperature to 100° C. It should be noted that the present inventors found out for the first time that the power factor dramatically increased from the room temperature to 400 K by substituting atoms in Mg sites with Cu while the thermoelectric performance varies significantly depending on the site subject to the substitution although the Cu substitution are seemingly similar as mentioned above.

Figure 7:
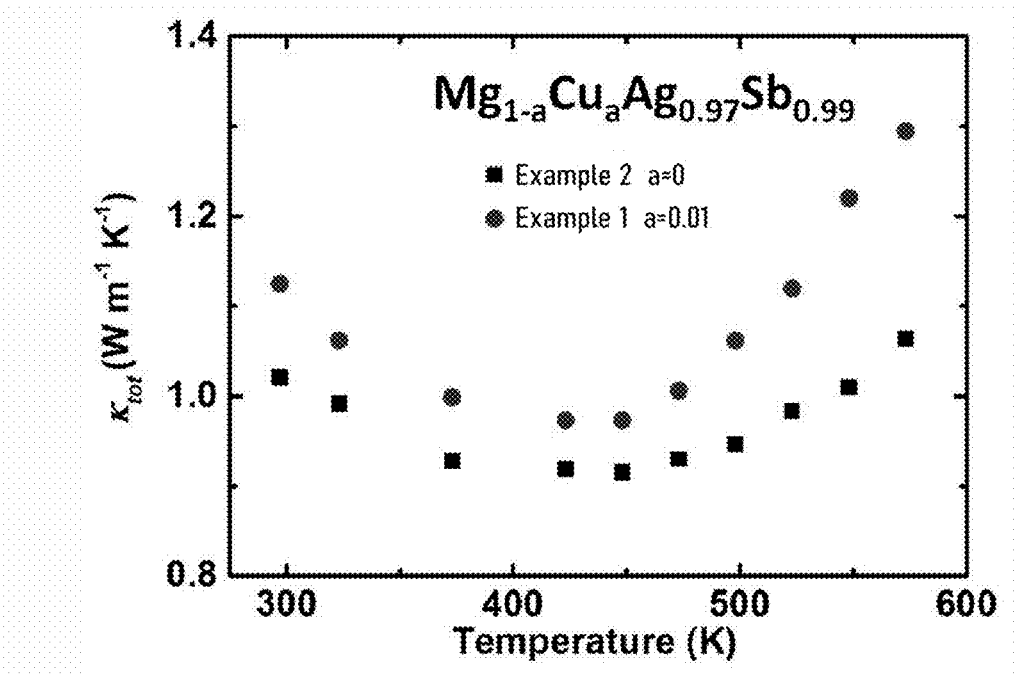
FIG. 7 shows a diagram showing a temperature dependence of total thermal conductivity of the samples of Examples 1 to 2.

FIG. 7 shows a diagram showing the temperature dependence of the total thermal conductivity of the samples of Examples 1 to 2.

Figure 8:
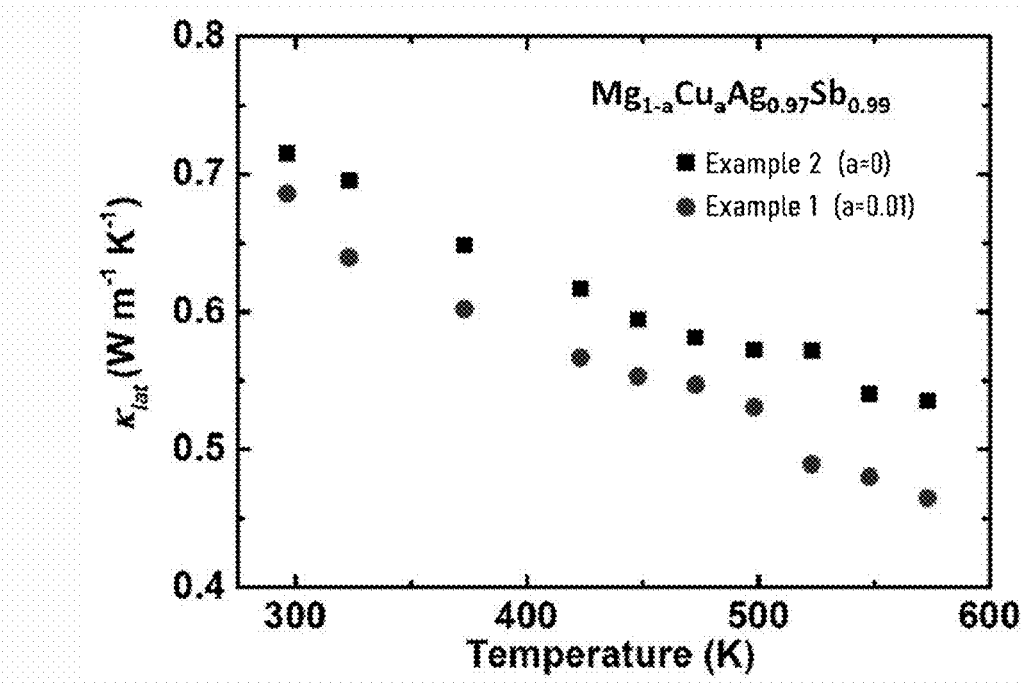
FIG. 8 shows a diagram showing a temperature dependence of lattice thermal conductivity of the samples of Examples 1 to 2.

FIG. 8 shows a diagram showing the temperature dependence of the lattice thermal conductivity of the samples from Examples 1 to 2.

According to FIG. 7, it was shown that the addition of Cu increased the total thermal conductivity over the entire measured temperature range. On the other hand, while the Lorentz number L was calculated and the electronic thermal conductivity was subtracted from the total thermal conductivity such that the lattice thermal conductivity was obtained, as shown in FIG. 8, the lattice thermal conductivity of the sample of Example 1 with added Cu was lower than that of the sample of Example 2 without any added Cu over the entire measured temperature range. From this, it was found that the addition of Cu was effective in phonon scattering.

Figure 9:
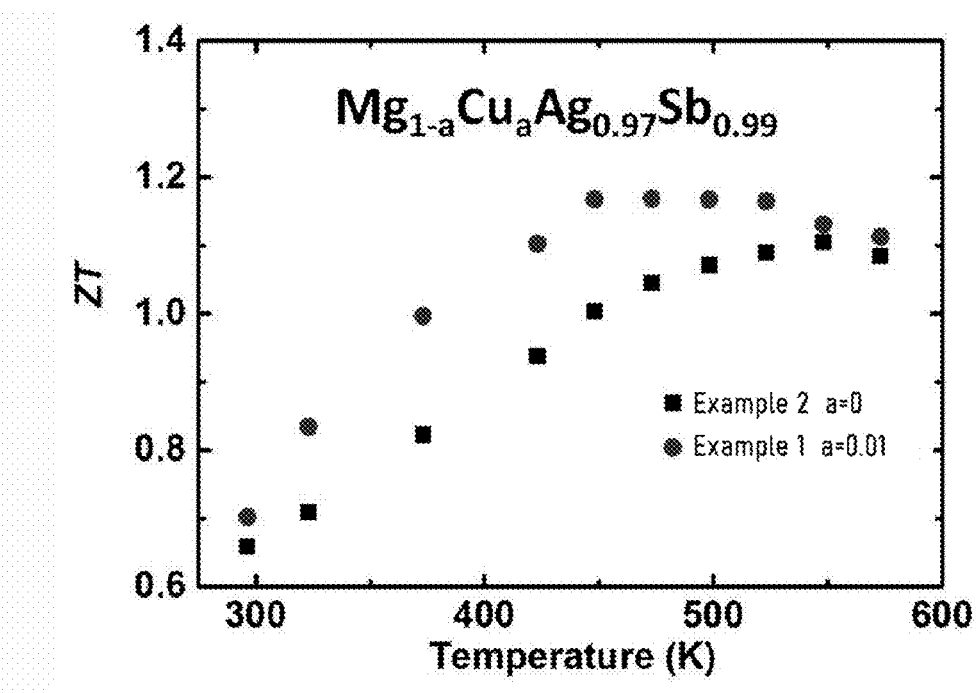
FIG. 9 shows a diagram showing a temperature dependence of a dimensionless thermoelectric figure of merit ZT of the samples of Examples 1 to 2.

FIG. 9 shows a diagram showing the temperature dependence of the dimensionless thermoelectric figure of merit ZT of the samples of Examples 1 to 2.

According to FIG. 9, it was found that the ZT of the sample of Example 1 with added Cu was increased over the entire measured temperature range as compared to that of the sample of Example 2 without any added Cu. In particular, it was found that the sample of Example 1 with added Cu showed significantly this tendency in the relatively low temperature region not exceeding 400 K and achieved large values at least 0.5 at room temperature. As explained with reference to FIG. 6, the power factor is significantly increased in the thermoelectric material of the invention such that further increase in ZT can be expected if the thermal conductivity is selectively reduced by controlling the morphology of the material, for example.

The above thermoelectric properties are summarized in Table 2. In Table 2, "E" represents a power of 10.

TABLE 2

| | | | Thermal | | | Dimensionless |
|---|---|---|---|---|---|---|
| | Electric | Electric | conductivity | Seebeck | Power factor | thermoelectric |
| | resistivity σ | conductivity | $K_{tot}$ | coefficients S | PF | figure of merit |
| Example | (Ωm) | (Sm$^{-1}$) | (Wm$^{-1}$K$^{-1}$) | (μVK$^{-1}$) | (μWcm$^{-1}$K$^{-2}$) | ZT |
| 1 | 1.21E−05 | 82921.28 | 1.13 | 179.37 | 26.68 | 0.70 |
| 2 | 1.63E−05 | 61349.69 | 1.02 | 190.26 | 22.21 | 0.66 |

According to Table 2, it was found that the sample in Example 1 with added Cu had a large electric conductivity and an improved power factor at room temperature. And, the amount of added Cu (a value) was shown to be preferable in the range of $0.005 \leq a \leq 0.05$, especially in the range of $0.005 \leq a \leq 0.02$.

INDUSTRIAL APPLICABILITY

In an embodiment of the present invention, the thermoelectric material has excellent thermoelectric performance especially near room temperature, and can serve as an alternative material to the $Bi_2Te_3$-based material, and is used in the thermoelectric cooling device and the power generation device for various electric equipment. In particular, if thinning is conducted, flexible thermoelectric power generation element can be provided as an IoT power source.

EXPLANATION OF NUMERALS 200 thermoelectric power generation element
210 n-type thermoelectric material
220 p-type thermoelectric material
230, 240 electrodes

What is claimed is:

1. A thermoelectric material comprising an inorganic compound comprising: magnesium (Mg), silver (Ag), antimony (Sb), and copper (Cu), wherein the inorganic compound is represented by $Mg_{1-a}Cu_aAg_bSb_c$, wherein the parameters a, b and c satisfy:

$0 < a < 0.1$,
$0.95 \leq b \leq 1.05$, and
$0.95 < c < 1.05$ wherein the inorganic compound comprises α-phase of a half-Heusler structure, in which Mg sites are partially replaced with Cu, and a symmetry of space group I-4c2.

2. The thermoelectric material according to claim 1 wherein the parameter a satisfies:

$0.005 \leq a \leq 0.05$.

3. The thermoelectric material according to claim 2 wherein the parameter a satisfies:

$0.005 \leq a \leq 0.02$.

4. The thermoelectric material according to claim 3 wherein the thermoelectric material comprises p-type.

5. The thermoelectric material according to claim 2 wherein the thermoelectric material comprises p-type.

6. The thermoelectric material according to claim 2 wherein the thermoelectric material comprises a form selected from a group consisting of a powder, a sintered body and a film.

7. The thermoelectric material according to claim 1 wherein the thermoelectric material comprises p-type.

8. The thermoelectric material according to claim 1 wherein the thermoelectric material comprises a form selected from a group consisting of a powder, a sintered body and a film.

9. The thermoelectric material according to claim 1 wherein the thermoelectric material comprises a thin film and an organic material.

10. A method of manufacturing a thermoelectric material as defined in claim 1 comprising the steps of:

blending a raw material comprising magnesium (Mg), a raw material comprising silver (Ag), a raw material comprising antimony (Sb), and a raw material comprising copper (Cu) and preparing a mixture thereof, and sintering the mixture.

11. The method according to claim 10 wherein the preparing the mixture comprises:

mechanical alloying the raw material comprising magnesium (Mg), the raw material comprising silver (Ag), and the raw material comprising copper (Cu); and mechanical alloying the raw material comprising Sb and a Mg—Ag—Cu alloy obtained by the previous mechanical alloying.

12. The method according to claim 10 wherein the sintering comprises spark plasma sintering.

13. The method according to claim 12 wherein the spark plasma sintering comprises sintering in a temperature range of at least 473 K and not exceeding 773 K, under a pressure of at least 50 MPa and not exceeding 100 MPa, for a duration of at least 1 minute and not exceeding 10 minutes.

14. The method according to claim 10, comprising pulverizing a sintered body obtained by the sintering.

15. The method according to claim 14, comprising mixing a powder obtained by the pulverizing with an organic material.

16. The method according to claim 10, comprising performing a physical vapor deposition method using, as a target, a sintered body having been obtained by the sintering.

17. A thermoelectric power generation element comprising p-type and n-type thermoelectric materials connected in series alternately, wherein the p-type thermoelectric material comprises a thermoelectric material as defined in claim 1.

* * * * *